(12) United States Patent
Ong

(10) Patent No.: US 10,818,334 B2
(45) Date of Patent: Oct. 27, 2020

(54) FERROELECTRIC MEMORY ARRAY WITH VARIABLE PLATE-LINE ARCHITECTURE

(71) Applicant: AUCMOS Technologies USA, Inc., Santa Clara, CA (US)

(72) Inventor: Adrian Ong, Pleasanton, CA (US)

(73) Assignee: AUCMOS TECHNOLOGIES USA, INC., Santa Clara, CA (US)

( * ) Notice: Subject to any disclaimer, the term of this patent is extended or adjusted under 35 U.S.C. 154(b) by 94 days.

(21) Appl. No.: 16/019,328

(22) Filed: Jun. 26, 2018

(65) Prior Publication Data

US 2019/0392884 A1 Dec. 26, 2019

(51) Int. Cl.
*G11C 7/12* (2006.01)
*G11C 11/22* (2006.01)
*G11C 7/18* (2006.01)
*G11C 5/14* (2006.01)
*G11C 8/14* (2006.01)

(52) U.S. Cl.
CPC ............ *G11C 11/2275* (2013.01); *G11C 5/14* (2013.01); *G11C 7/18* (2013.01); *G11C 8/14* (2013.01); *G11C 11/2255* (2013.01); *G11C 11/2257* (2013.01); *G11C 11/2273* (2013.01)

(58) Field of Classification Search
CPC ... G11C 11/22; G11C 2207/2227; G11C 7/06; G11C 7/14; G11C 8/20; G11C 11/2273; G11C 11/2275; G11C 7/18; G11C 8/14
See application file for complete search history.

(56) References Cited

U.S. PATENT DOCUMENTS

| 9,972,374 | B1 * | 5/2018 | Yan | ..................... G11C 11/2257 |
| 2005/0226028 | A1 * | 10/2005 | Takahashi | ............... G11C 11/22 365/145 |
| 2005/0286289 | A1 * | 12/2005 | Watanabe | ............... G11C 11/22 365/145 |
| 2007/0081374 | A1 * | 4/2007 | Koide | ................. H01L 27/0207 365/63 |
| 2019/0355404 | A1 * | 11/2019 | Ong | ..................... G11C 11/221 |

* cited by examiner

*Primary Examiner* — Hien N Nguyen
(74) *Attorney, Agent, or Firm* — Edward C. Kwok; VLP Law Group, LLP

(57) ABSTRACT

A ferroelectric memory array includes (a) a driver circuit providing a first signal and a second signal; (b) word lines each providing a word line signal; and (c) memory array sections. Each memory array section may include: (a) bit lines; (b) plate line segments each associated with a corresponding one of the word line signals; (c) local plate line decoders, each local plate line decoder (i) being associated with one of the plate line segments, (ii) receiving the corresponding word line signal of the associated plate line segment, the first signal and the second signal, and (iii) providing predetermined voltages on the associated plate line segment according to the received word line signal, the first signal and the second signal; and (d) memory cells, each memory cells having one or more ferroelectric capacitor connected between one of the plate line segments and one of the bit lines. The predetermined voltages output from a local plate decoder may include a voltage of the word line signal, a power supply voltage, or one half the power supply voltage.

12 Claims, 12 Drawing Sheets

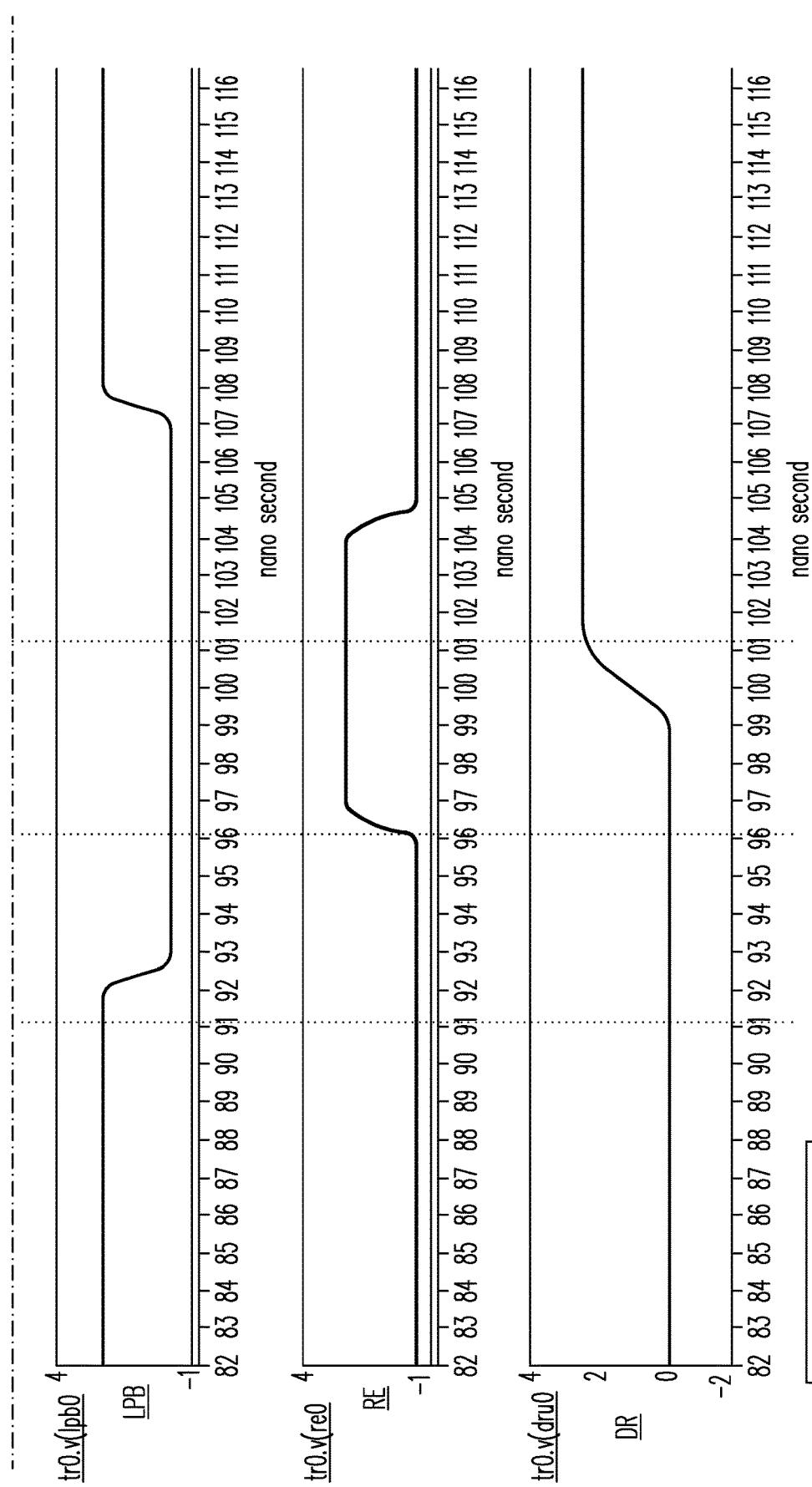

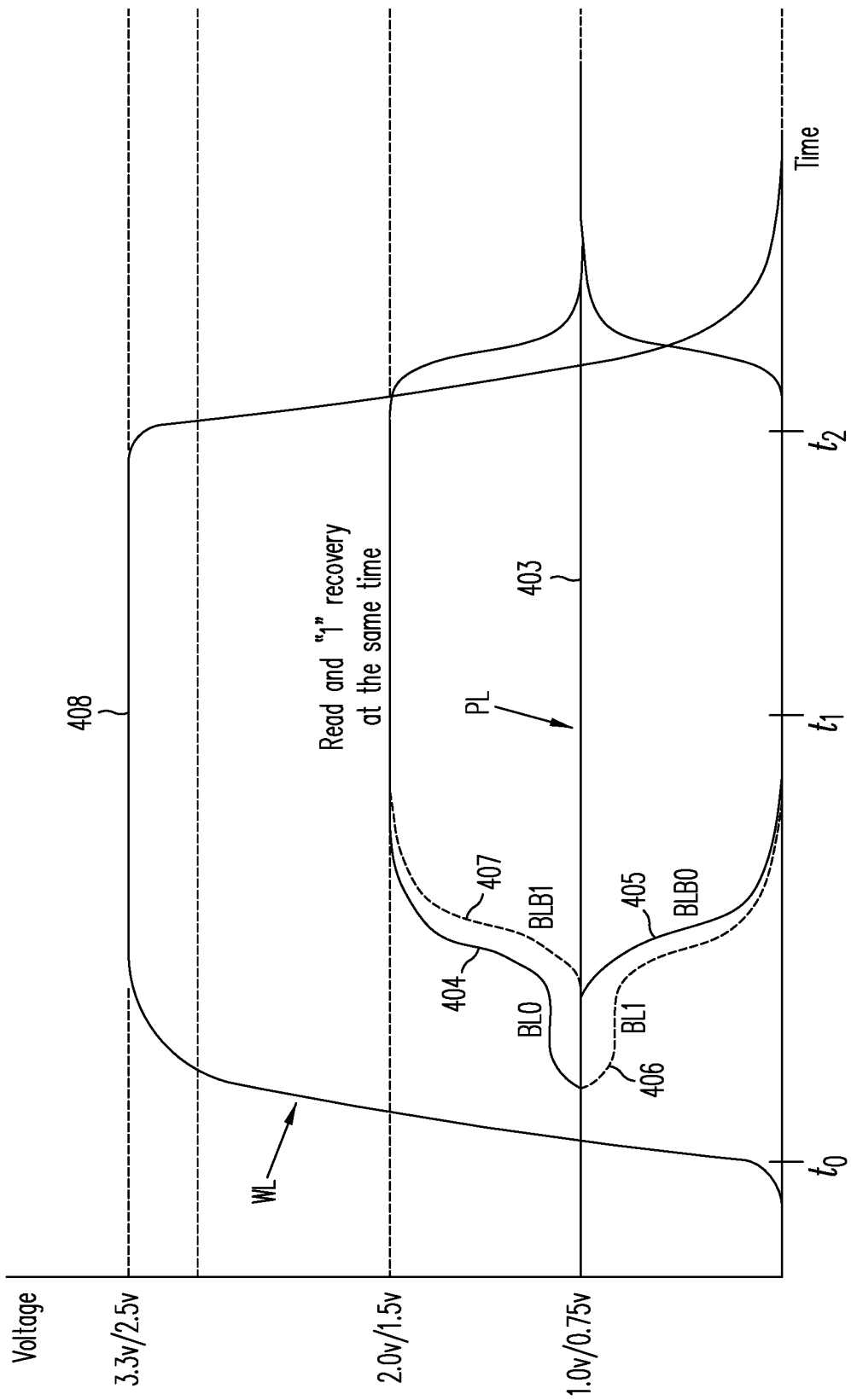

FERROELECTRIC MEMORY ARRAY WITH VARIABLE PLATE-LINE ARCHITECTURE

BACKGROUND OF THE INVENTION

1. Field of the Invention

The present invention relates to ferroelectric memory circuits. In particular, the present invention relates to high-density ferroelectric memory arrays requiring high read and write operation speeds.

2. Discussion of the Related Art

Ferroelectric memory arrays with segmented plate lines allow a reliable distribution of plate-line voltages, which provides both noise immunity and desirable speed in device operations. FIG. 1a shows schematically memory array 100 in the prior art having 1T1C memory cells supplied with a system of segmented plate lines. The building block memory cells of memory array 100 are known as 1T1C cells, as each cell consists of a single field effect transistor and a single ferroelectric capacitor. As shown in FIG. 1a, memory array 100 includes j rows and m columns of memory cells 107-1-1 to 107-1-m, 107-2-1 to 107-2-m, . . . , 107-j-1 to 107-j-m, accessible by j word lines 104-1 to 104-j each serving one row of memory cells. In addition, memory cell 100 is served by j plate line segments 103-1 to 103-j, each of which may be connected to global plate line 105 by one of the word lines. Data may be written or read from bit lines 109-1 to 109-m, each serving a column of memory cells. As shown in FIG. 1a, in addition to the m columns of memory cells memory array 100 also includes four columns of reference memory cells 108-1-1 to 108-4-j for generating reference signals that are used in sensing the data in the m memory cells. Each bit line serving a column of memory cells is coupled to one of sense amplifier circuits 101-1 to 101-n. Each bit line serving a column of reference memory cells is coupled to one of reference signal generator 108-1 to 108-2.

As shown in FIG. 1a, each memory cell includes a ferroelectric capacitor and a field effect transistor connected in series between a corresponding plate line segment and a corresponding bit line. A corresponding word line is activated when the memory cell is selected. The activated word line turns on the field effect transistor of the selected cell to connect the ferroelectric capacitor of the selected memory cell to the corresponding bit line. At the same time, the activated word line also turns on a corresponding one of plate line segment select transistors 118-1 to 118-j, which activates the corresponding plate line segment.

As is known to those of ordinary skill in the art, a binary data value is stored as "charge" in the ferroelectric capacitor of the ferroelectric memory cell. The reading and writing of such a binary value from and to such a ferroelectric memory cell is also well-known to those of ordinary skill in the art. It is worth mentioning that, reading of a ferroelectric memory cell in one of the two binary states may be destructive. By convention, the state that is vulnerable to a destructive read is assigned logic value '1.' To read a memory cell, the plate line is driven to a high voltage and the signal on the bit line is sensed. Driving the plate line to a high voltage writes a logic value "0" into the memory cell. To preserve the state of the ferroelectric memory cell being read, a write operation is required to restore the state lost to the reading operation.

FIG. 1b shows memory array 200 in the prior art having 2T2C memory cells supplied with a system of segmented plate lines. As shown in FIG. 1b, memory array 200 is organized into m sections of memory cells, with each section having j rows and n columns of memory cells served by j plate line segments of that section. For example, the memory cells of the i-th section are served by plate line segments 103-i-1 to 103-i-j. In FIG. 1b, j word lines serve the n rows of memory cells in all sections. Unlike memory array 100, each memory cell in memory array 200 includes two 1T1C cells, to allow a binary value to be stored in complementary states. Operations for reading from and writing into a memory cell are achieved using corresponding true and complement bit lines. For example, memory cell 207-1-1 in FIG. 2a is accessed via true and complement bit lines 109-1t and 109-1c.

FIG. 1c shows an exemplary sense amplifier 250 suitable for use with memory array 200 of FIG. 1b. FIG. 1d shows the associated waveforms of sense amplifier 250 during a read operation. As shown in FIG. 1c, sense amplifier 250 include an equalization circuit 251, data latch 252 and input/output circuit 253. As shown in FIG. 1d, initially or during a quiescent state (i.e., prior to time $t_0$), signal EQ is asserted, so that both true and complement bit lines BLT and BLC are forced to a ground voltage value. When a read operation is initiated at time $t_0$, (i) signal EQ is de-asserted to disconnect equalizer circuit 251 from bit lines BLC and BLT, (ii) the corresponding word line WL is activated, (iii) signal PL on the corresponding plate line segment is driven to its operational value, and (iv) signals LNB and LPB enables latch circuit 252 by connecting latch circuit 252 to power and ground voltage sources. Between times $t_0$ and $t_1$, the memory cell drives the stored complement binary value onto true and complement bit lines BLC and BLT. At time $t_1$, after the signal across bit lines BLT and BLC has settled, the stored complement binary value has also settled in latch circuit 252. As discussed above, a read operation on a ferroelectric capacitor is destructive to one of the two binary states. Latch circuit 252 allows the complement binary value latched to be written back into the memory cell. At time $t_1$, signal CSEL is asserted to enable input/output circuit 253 to output the complement binary value read to a circuit external to memory array 200. Data read signal DR develops after CSEL is asserted. At time $t_2$, signal PL of the corresponding line segment returns to its quiescent value to write back the complement binary value into the memory cell.

SUMMARY

According to one embodiment of the present invention, a ferroelectric memory array includes (a) a driver circuit providing a first signal and a second signal; (b) word lines each providing a word line signal; and (c) memory array sections. Each memory array section may include: (a) bit lines; (b) plate line segments each associated with a corresponding one of the word line signals; (c) local plate line decoders, each local plate line decoder (i) being associated with one of the plate line segments, (ii) receiving the corresponding word line signal of the associated plate line segment, the first signal and the second signal, and (iii) providing predetermined voltages on the associated plate line segment according to the received word line signal, the first signal and the second signal; and (d) memory cells, each memory cells having one or more ferroelectric capacitor connected between one of the plate line segments and one of the bit lines. The predetermined voltages output from a local plate decoder may include a voltage of the word line signal, a power supply voltage, or one half the power supply voltage.

In one embodiment, a write operation on a memory cell the memory array imposes a voltage difference across at least one of the ferroelectric capacitors of the memory cell that equals substantially the power supply voltage. In another embodiment, both read and write operations on a memory cell impose a voltage difference across at least one of the ferroelectric capacitors of the memory cell that equals substantially one half the power supply voltage.

According to one embodiment of the present invention, the ferroelectric memory array may include a signal generation circuit that operates selectively under a first mode and a second mode. The signal generation circuit generates different sets of signal values for the first signal and the second signal according to whether it is operating in the first mode or in the second mode. In one implementation, under the first mode, the first and second signals each switch between two predetermined power supply voltages and, under the second mode, the first and second signals each have a constant voltage, such as one half of a predetermined power supply voltage. Furthermore, in one embodiment, a data retention time associated with a write operation under the first mode is substantially longer than a data retention time associated with a write operation under the second mode. Although operating with a lower data retention time, the second mode does not require circuitry for generating the higher programming voltage and may operate at a higher speed and lower power.

The present invention is better understood upon consideration of the detailed description below in conjunction with the accompanying drawings.

BRIEF DESCRIPTION OF THE DRAWINGS

FIG. 1d-1, FIG. 1d-2 and FIG. 1d-3 and the associated FIG. 1d key show associated waveforms of signals in sense amplifier 250 during a read operation.

FIG. 2b shows local plate line decoder 307, which is suitable for implementing any of local plate line decoders 307-1-1 to 307-m-j of FIG. 2a.

FIG. 2c shows driver circuit 350 which provides signals "GPL" and "PRE" to be respectively placed on global plate lines (GPLs) 308-1 to 308-m and pre-charge lines (PREs) 309-1 to 309-m of ferroelectric memory array 300 of FIG. 2a.

FIG. 3b illustrates a read operation on a memory cell in ferroelectric memory array 300 under a second mode of operation, according to one embodiment of the present invention.

FIG. 4a shows ferroelectric memory array 400 with 1T1C memory cells and local plate line decoders of the present invention, suitable for implementing any of memory array sections 302-1, . . . , 302-m in ferroelectric memory array 300 of FIG. 2a.

FIG. 4b shows ferroelectric memory array 450 with 2T2C memory cells and local plate line decoders of the present invention, suitable for implementing any of memory array sections 302-1, . . . , 302-m in ferroelectric memory array 300 of FIG. 2a.

To facilitate cross reference across the figures, like elements in the figures are assigned like reference numerals.

DETAILED DESCRIPTION OF THE PREFERRED EMBODIMENTS

The present invention provides, in a ferroelectric memory array of a hierarchical plate line architecture, a local plate line decoder to drive a plate line segment. The present invention improves write speeds and provides better noise immunity, while providing an option to adjust the write energy that affects data retention. The memory may be operated in two or more modes. In one mode, the plate line may be pre-charged to one-half the memory array supply voltage (½ Vdda) and may be kept constant at Vdda/2 during read or write operation.

Figure 1A:
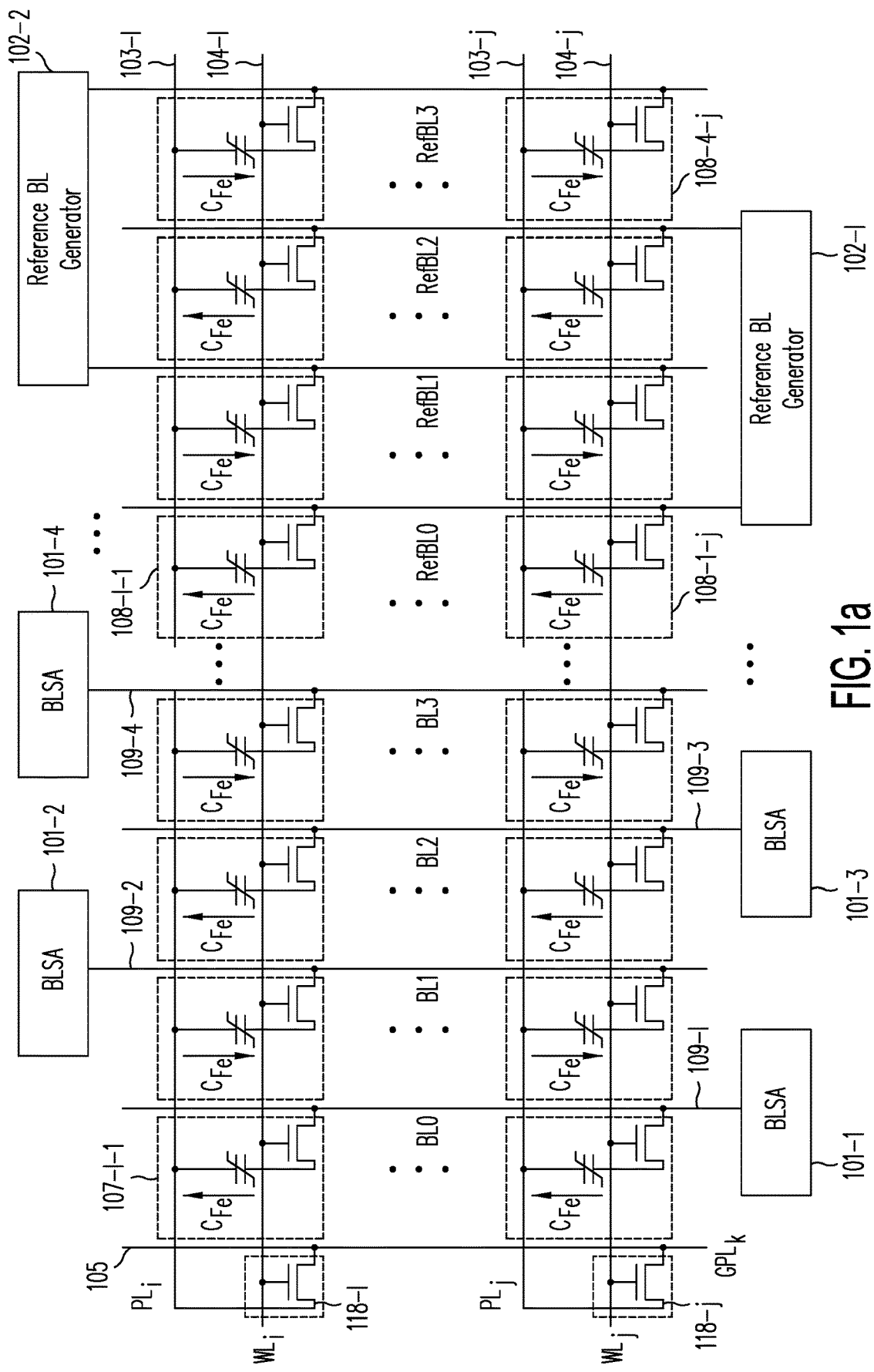
FIG. 1a shows schematically memory array 100 in the prior art having 1T1C cells supplied with a system of segmented plate lines.
Figure 1B:
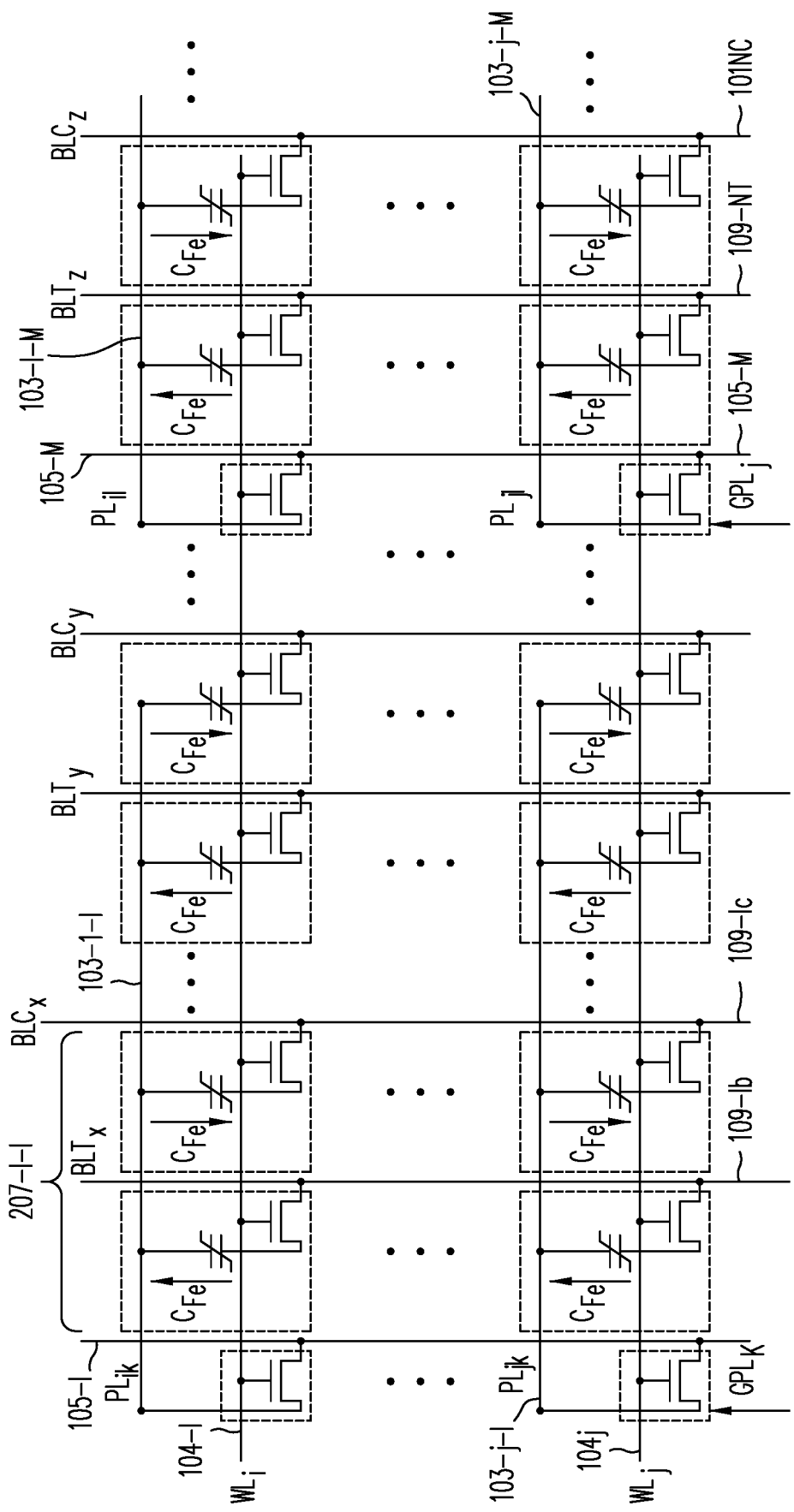
FIG. 1b shows schematically memory array 200 in the prior art having 2T2C cells supplied with a system of segmented plate lines.
Figure 1C:
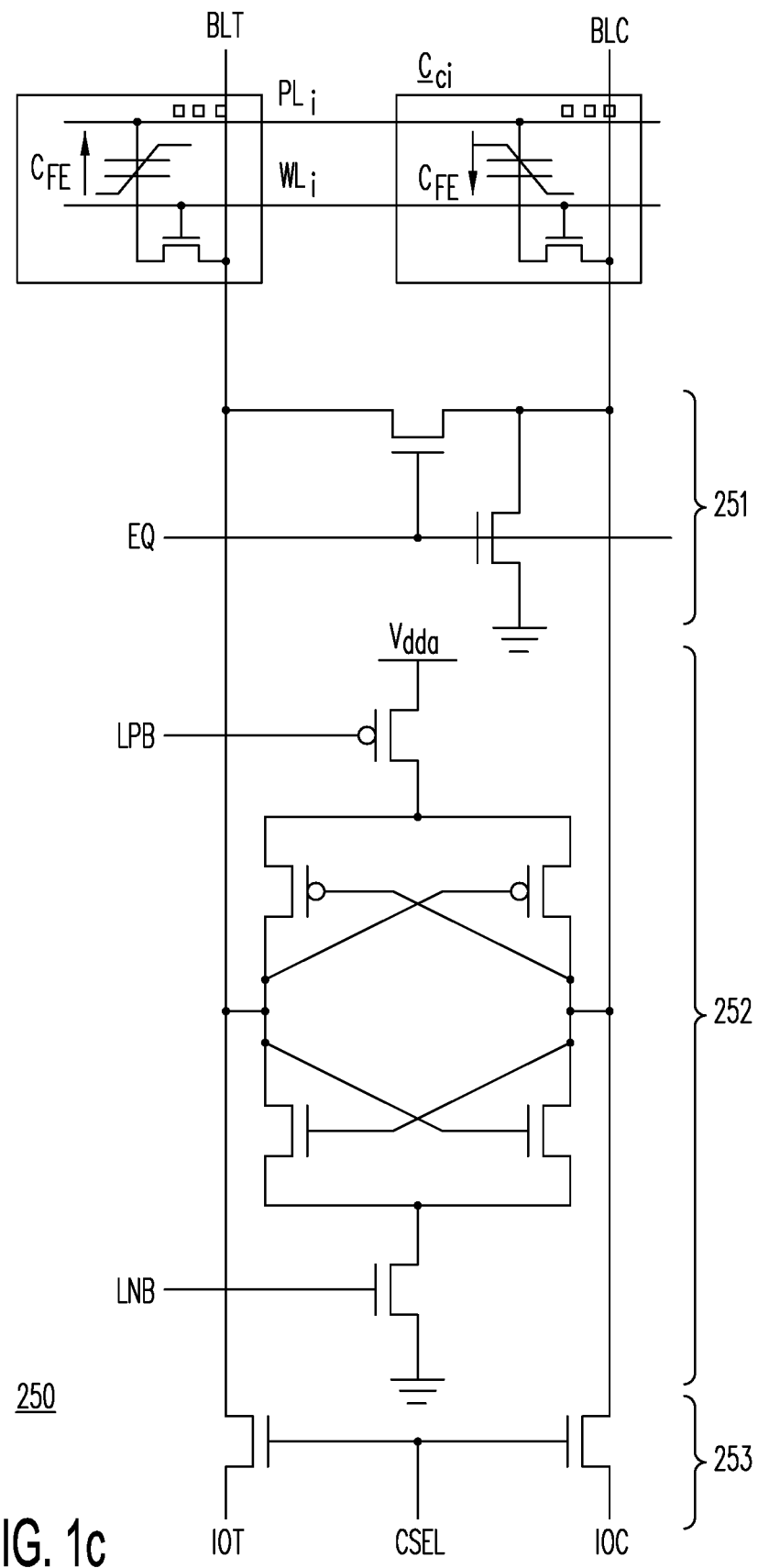
FIG. 1c shows an exemplary sense amplifier 250 suitable for use with memory array 200 of FIG. 1b.
Figures 1, 1D:
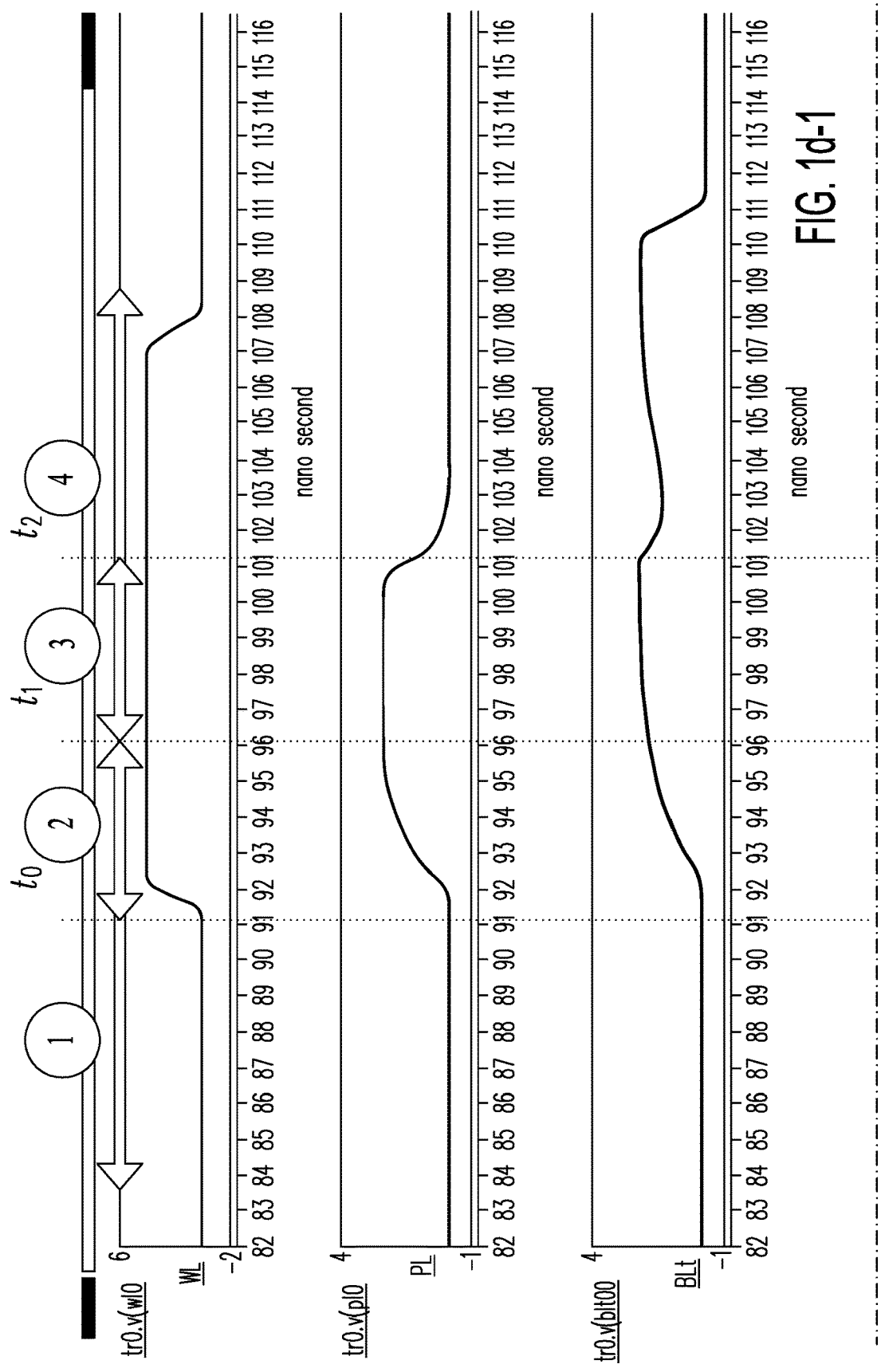
Figures 1, 1D, 2:
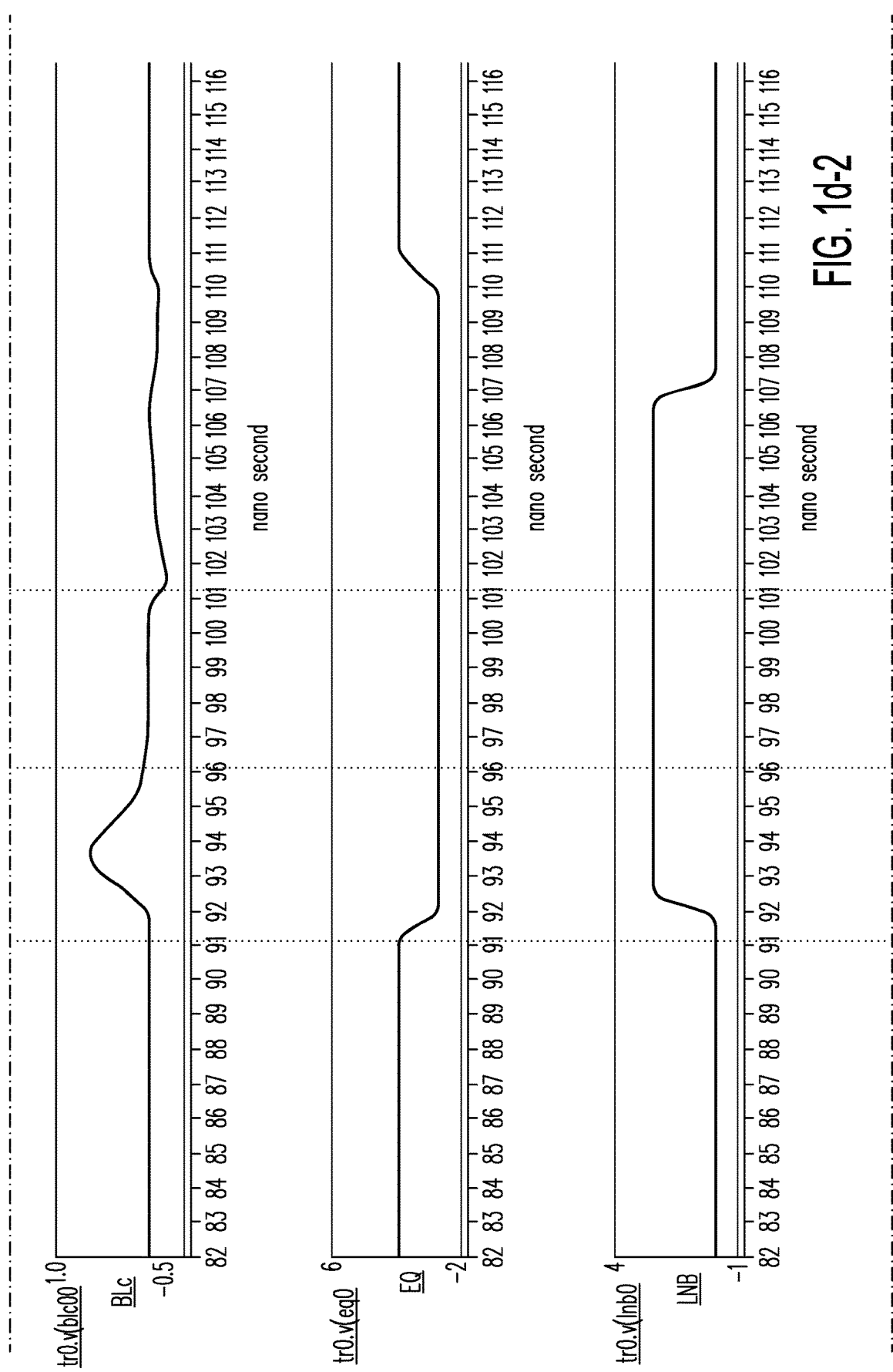
Figure 2A:
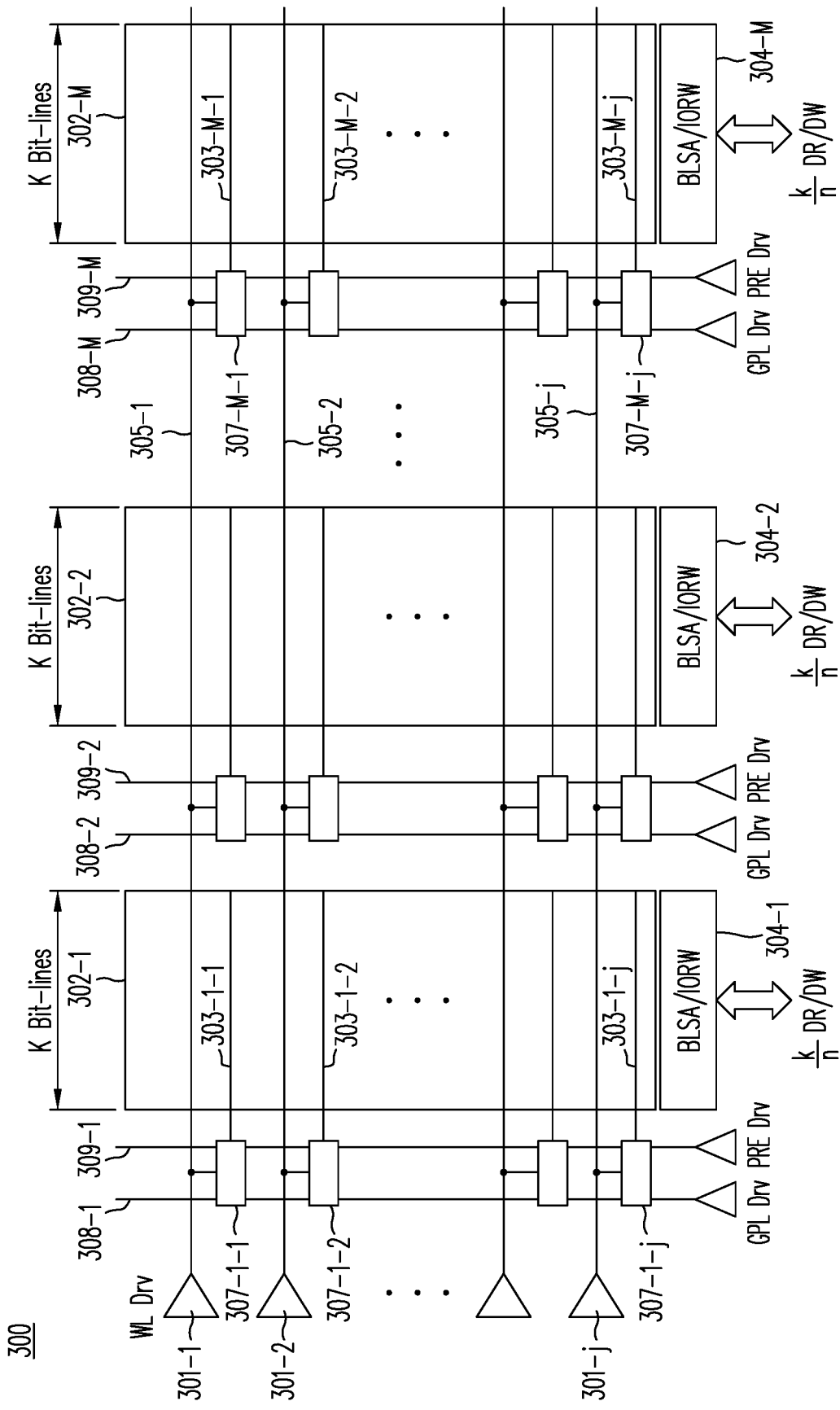
FIG. 2a shows ferroelectric memory array 300 with local plate line decoders 307-1-1 to 307-m-j, according to one embodiment of the present invention.

To illustrate, FIG. 2a shows ferroelectric memory array 300 with local plate line decoders 307-1-1 to 307-m-j, according to one embodiment of the present invention. As shown in FIG. 2a, ferroelectric memory array 300 includes m memory array sections 302-1, . . . , 302-m, each having j rows of memory cells. Memory array sections 302-1, . . . , 302-m are served by j word lines 305-1 to 305-j, driven respectively by word line drivers 401-1 to 401-j. In addition, each memory array section is served by a local plate line segment (i.e., one of plate line segments 303-1-1 to 303-1-j). Plate line segments 303-1-1 to 303-1-j are each driven by a corresponding one of local plate line decoders 307-1-1 to 307-m-j. Memory array sections 302-1, . . . , 302-m each include a corresponding one of sense amplifier and input/output circuits 304-1 to 304-m. These sense amplifier and input/output circuits may each be implemented using conventional circuitry such as those shown in FIG. 1c. In one embodiment, each of memory array sections 302-1 to 302-m are served by k bit lines. Sense amplifier and input/output circuits 304-1 to 304-m handle reading and writing in parallel signals on k/n of the k bit lines in its corresponding memory array section. Each memory cell of ferroelectric memory array 300 may be any ferroelectric memory cell, such as the 1T1C memory cell of FIG. 1a, or the 2T2C memory cell of FIG. 1b. In addition, memory array section 302-1 to 302-m are each served by a global plate line (GPL) and a pre-charge control line (PRE), which are shown in FIG. 2a as GPLs 308-1 to 308-m and PREs 309-1 to 309-m, respectively.

Figure 2B:
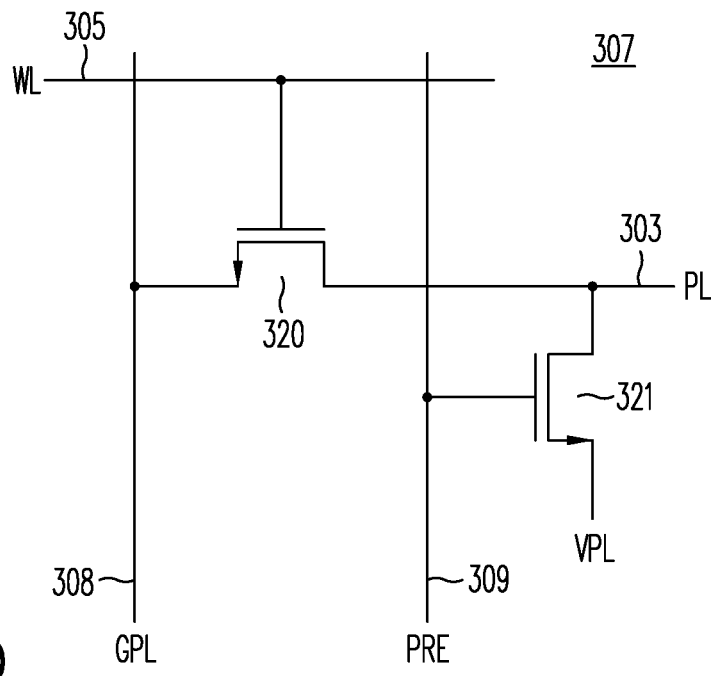

FIG. 2b shows local plate line decoder 307, which is suitable for implementing any of local plate line decoders 307-1-1 to 307-m-j of FIG. 2a. As shown in FIG. 2b, local plate line decoder 307 receives the signals on a corresponding set of word line, GPL and PRE (i.e., word line 305, GPL 308 and PRE 309) to provide a signal on a corresponding plate line segment (i.e., plate line segment 303). Local plate line decoder 307 includes (i) MOS transistor 320, which is controlled at its gate electrode by the signal on word line 305, MOS transistor 320 connecting GPL 308 to plate line segment 303, and (ii) MOS transistor 321, which is controlled at its gate electrode by the signal on PRE 309, MOS transistor 321 pre-charging plate line segment 303 to a pre-determined voltage VPL.

Figure 3A:
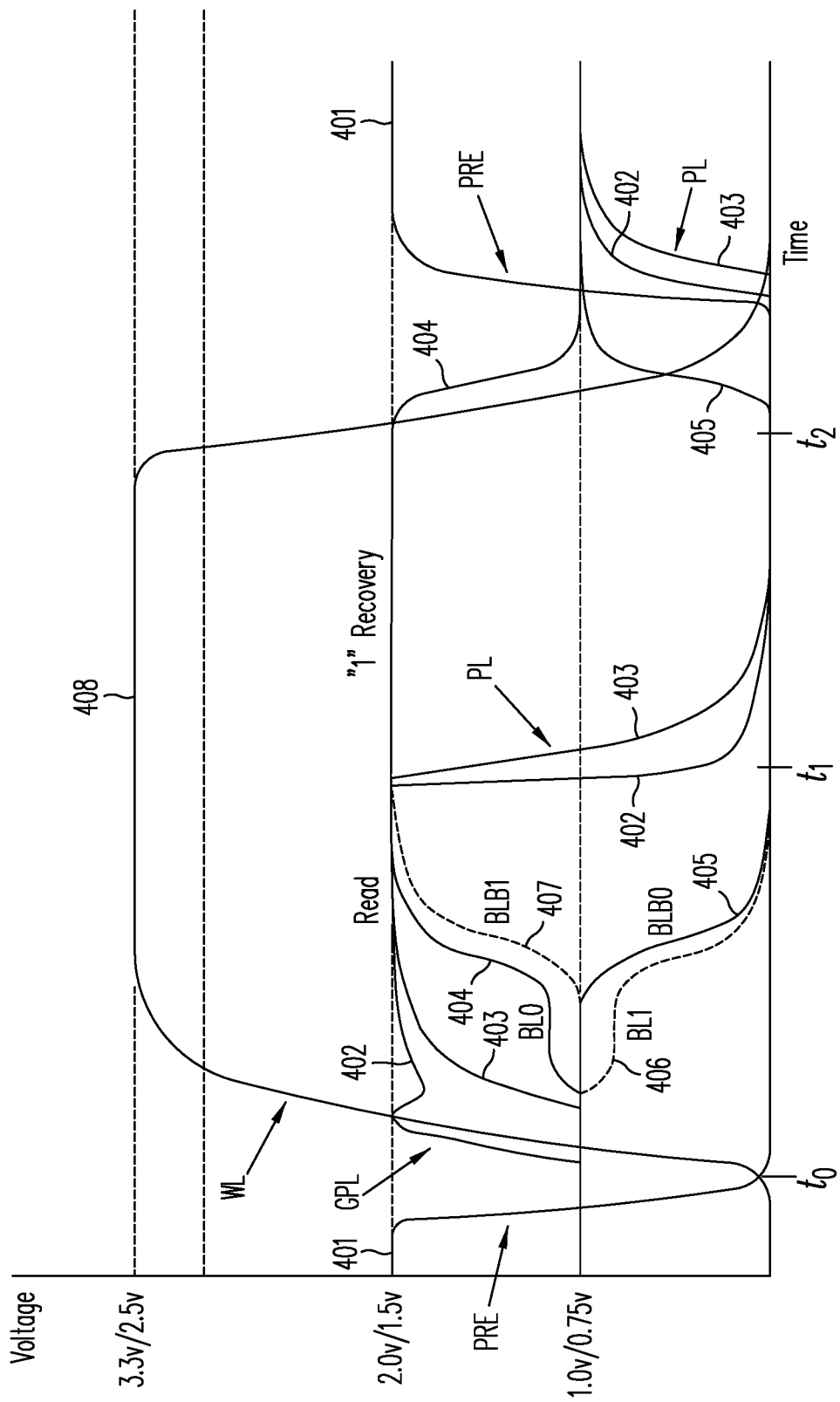
FIG. 3a illustrates a read operation on a memory cell in ferroelectric memory array 300 under a first mode of operation, according to one embodiment of the present invention.

Ferroelectric memory array 300 may be operated in one of two modes. In a first mode, to write into a memory cell, a higher voltage difference is imposed across each ferroelectric capacitor. In a second mode, to write into a memory cell, a lower voltage is imposed across each ferroelectric capacitor. The first mode provides a longer data retention time (e.g., 10 years or more). While the second mode provides a shorter data retention time (e.g., one year or less), it provides a lower-power operation and a faster random access time. FIG. 3a illustrate a read operation of a memory cell in ferroelectric memory array 300 under the first mode of operation, according to one embodiment of the present invention.

In FIG. 3a, initially, prior to the beginning of the read operation at time $t_0$, the signal on the PRE of each memory array section (i.e., any of PREs 309-1 to 309-m; waveform 401 of FIG. 3a) is asserted, such that the associated plate line segments are at a predetermined quiescent plate line voltage $V_{PL}$ (e.g., 0.75 to 1.0 volts, or half the memory array supply voltage $V_{dda}$). In preparation of the read operation, the signal on the PREs 309-1 to 309-m are de-asserted, such that MOS transistor 321 of each local plate line decoder (e.g., any of local plate line decoders 307-1-1 to 307-m-j) is switched off.

At time $t_0$, the signal on each GPL (waveform 402) is driven to a predetermined plate line read voltage (e.g., 1.5-2.0 volts, or the memory supply voltage $V_{dda}$), while the word line associated with the selected memory cell to be read (e.g., any of word lines 305-1 to 305-j) is driven to a predetermined read voltage (2.5-3.3 volts; waveform 408). The predetermined read voltage turns on MOS transistor 320 of the local plate line decoder associated with the selected memory cell to be read, such that the voltage on the associated plate line segment (waveform 403) follows the signal on the associated GPL. At the same time, each bit line associated with each ferroelectric capacitor in the memory cell is coupled to a sense amplifier associated with the selected memory cell (i.e., a sense amplifier in the corresponding one of sense amplifier and input/output circuits 304-1 to 304-m)

The example of FIG. 3a is taken from an implementation of a 2T2C memory cell, which includes two ferroelectric capacitors storing complementary values. FIG. 3a provides waveforms 404 (BL0) and 405 (BLB0), corresponding to the signals on the bit lines associated with the ferroelectric capacitors storing the "true" and "complement" values, when the memory cell stores the logic '0' value. FIG. 3a also provides waveforms 406 (BL1) and 407 (BLB1), corresponding to the signals on the bit lines associated with the ferroelectric capacitors storing the "true" and "complement" values, when the memory cell stores the logic '0' value. In the case when the memory cell stores logic value '0', waveforms 404 (BL0) and 405 (BLB0) are pulled by the sense amplifier to $V_{dda}$ and ground, respectively. In the case when the memory cell stores logic value '1', waveforms 406 (BL1) and 407 (BLB1) are pulled by the sense amplifier to ground and $V_{dda}$, respectively.

As known to those of ordinary skill in the art, a read operation on a ferroelectric memory cell programmed to the logic '1' state may be destructive. Accordingly, a write-back operation is carried out to restore the logic state prior to completing the read operation. As shown in FIG. 3a, at time $t_1$, the signal on the associated GPL (waveform 402) is driven to ground so that the voltage on the associated plate line segment (waveform 403) follows in time also to ground voltage. At this time, the voltage difference between the associated plate line segment and the "true" bit line in the memory cell storing the logic '1' value is $V_{dda}$, which effectuates an effective write-back of the logic value into the corresponding ferroelectric capacitor. (Similarly, for the ferroelectric memory cell storing the '0' logic value, the voltage difference between the associated plate line segment and the "complement" bit line is $V_{dda}$, which effectuates an effective write back of the logic value to the corresponding ferroelectric capacitor). The write-back operation of FIG. 3a stores sufficient "charge" into the ferroelectric capacitors for a long retention time (e.g., 10 years or more). (In this embodiment, programming voltage $V_{pp}$ equals the memory array supply voltage $V_{dda}$.)

At time $t_2$, having completed the write-back operations, the read operation is complete. Accordingly, the signal on the associated word line (i.e., waveform 408) is de-asserted, such that MOS transistor 320 of the associated local plate line decoder is turned off. The voltages on the associated bit lines are also returned to quiescent voltage ½ $V_{dda}$. Thereafter, as shown in FIG. 3a, the signals on the PREs are asserted, such that the plate line segments are driven to quiescent voltage ½ $V_{PL}$, which is also $V_{dda}$ in this example.

FIG. 3b illustrates a read operation of a memory cell in ferroelectric memory array 300 under a second mode of operation, according to one embodiment of the present invention. In the example of FIG. 3b, the signals on the PREs are set to a predetermined voltage that is sufficiently high (e.g., $V_{dda}$ or $V_{PP}$) that MOS transistor 321 of each local plate line decoder is constantly conducting. Therefore, in the example of FIG. 3d, the signals on all plate line segments are maintained at ½ $V_{dda}$ (e.g., 0.75-1.0 volts) throughout the read operation. In this example, the signals on the GPLs are also set to ½ $V_{dda}$ throughout.

At time $t_0$, the signal on the associated word line of the memory cell to be read is brought to the predetermined read voltage (e.g., 2.5-3.3 volts). The example of FIG. 3b is also taken from an implementation of a 2T2C memory cell, which includes two ferroelectric capacitors storing complementary values. Therefore, as in FIG. 3a, FIG. 3b provides waveforms 404 (BL0) and 405 (BLB0), corresponding to the signals on the bit lines associated with the ferroelectric capacitors storing the "true" and "complement" values, when the memory cell stores the logic '0' value. FIG. 3b also provides waveforms 406 (BL1) and 407 (BLB1), corresponding to the signals on the bit lines associated with the ferroelectric capacitors storing the "true" and "complement" values, when the memory cell stores the logic '0' value. In the case when the memory cell stores logic value '0', waveforms 404 (BL0) and 405 (BLB0) are pulled by the sense amplifier to $V_{dda}$ and ground, respectively. In the case when the memory cell stores logic value '1', waveforms 406 (BL1) and 407 (BLB1) are pulled by the sense amplifier to ground and $V_{dda}$, respectively.

In the example of FIG. 3b, the write operation for restoring the logic '1' state also begins at time $t_1$. Unlike the example of FIG. 3a, at time $t_1$, the voltage difference between the associated plate line segment and the "true" bit line in the memory cell storing the logic '1' value is ½ $V_{dda}$, which also effectuates the write-back of the logic value into the corresponding ferroelectric capacitor. (Similarly, for the ferroelectric memory cell storing the '0' logic value, the voltage difference between the associated plate line segment and the "complement" bit line is ½ $V_{dda}$, which also effectuates a write-hack of the logic value to the corresponding ferroelectric capacitor). However, unlike the example of FIG. 3a, the write-back operation of FIG. 3b stores only sufficient "charge" into the ferroelectric capacitors for a lesser retention time (e.g., 1 year or less).

At time $t_1$, the signal on the word line associated with the selected memory cell is de-asserted, as shown in FIG. 3b, and the read operation is complete.

Figure 2C:
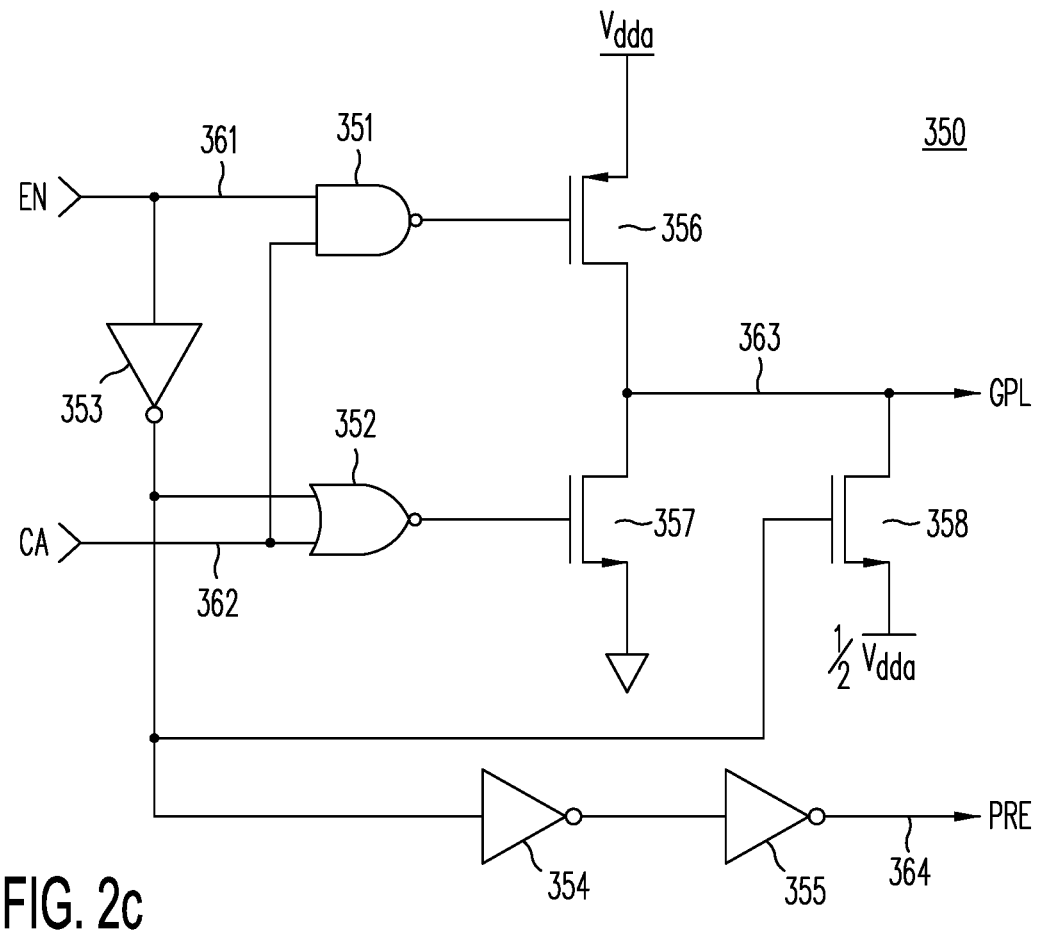

FIG. 2c shows driver circuit 350 which provides signals "GPL" and "PRE" respectively on GPLs 308-1 to 308-m and PREs 309-1 to 309-m of ferroelectric memory array 300 of FIG. 2a. As shown in FIG. 2c, driver circuit 350 receives enable signal EN and control signal CA at terminals 361 and 362, respectively, and provides output signals GPL and PRE at terminals 363 and 364, respectively. Driver circuit 350 includes NAND gate 351, NOR gate 352, inverters 353, 354 and 355, PMOS transistor 356 and NMOS transistor 358.

During the first mode of operation (i.e., the mode of operation illustrated in FIG. 3a), signal EN is asserted prior to time $t_0$ and during the read operation to cause signal PRE to be de-asserted. While de-asserted, signal PRE turns off transistor 321 of local plate line decoder 307, so that the associated plate line segment can be driven by the associated GPL at memory cells with asserted word line signals. At the same time, de-asserted signal EN turns off NMOS transistor 358, to allow the voltage of signal GPL to be controlled by PMOS transistors 356 and 367, respectively. During the read operation, control signal CA switches the voltage of signal GPL between $V_{dda}$ and ground through the actions of NAND gate 351 and NOR gate 352, respectively, on PMOS transistor 356 and NMOS transistor 357, as required, when the associated sense amplifier reads the logic state of the associated memory cell and during the write-back phase of the read value, respectively. After the read operation is complete, signal EN is de-asserted, to assert signal PRE, to turn off PMOS transistor 356 and NMOS transistor 357, and to turn on NMOS transistor 358 (which provides voltage ½ $V_{dda}$ on signal GPL). Asserted signal PRE turns on MOS transistor 321 of local plate line decoder 307 to bring the associated plate line segment to quiescent voltage ½ $V_{dda}$.

During the second mode of operation (i.e., the mode of operation illustrated in FIG. 3b), signal EN is asserted, so that PMOS transistor 356 and NMOS transistor 357 are turned off by NAND gate 351 and NOR gate 352, respectively. At the same time, signal EN causes signal PRE to be at logic value '1' and turns on NMOS transistor 358 to provide voltage ½ $V_{dda}$ on signal GPL. At logic value '1', signal PRE turns on MOS transistor 321 of local plate line decoder 307, thereby driving its associated plate line segment to voltage $V_{PL}$.

Figure 4A:
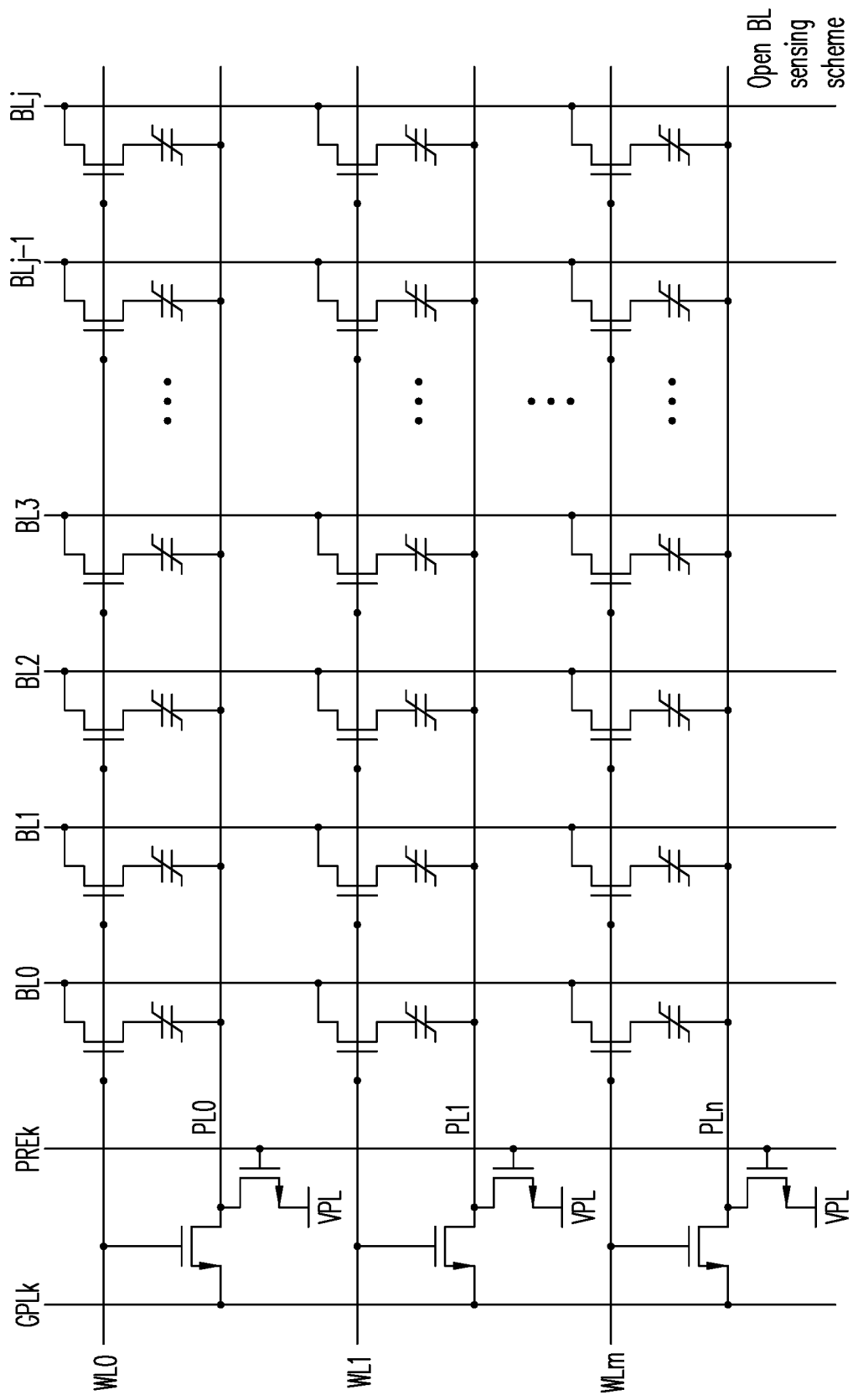

FIG. 4a shows ferroelectric memory array 400 with local plate line decoders of the present invention, suitable for implementing any of memory array sections 302-1, . . . , 302-m in ferroelectric memory array 300 of FIG. 2a. Ferroelectric memory array 400 implements an "open bit line" sensing scheme, known to those of ordinary skill in the art. Each memory cell of ferroelectric memory array 400 is a 1T1C cell.

Figure 4B:
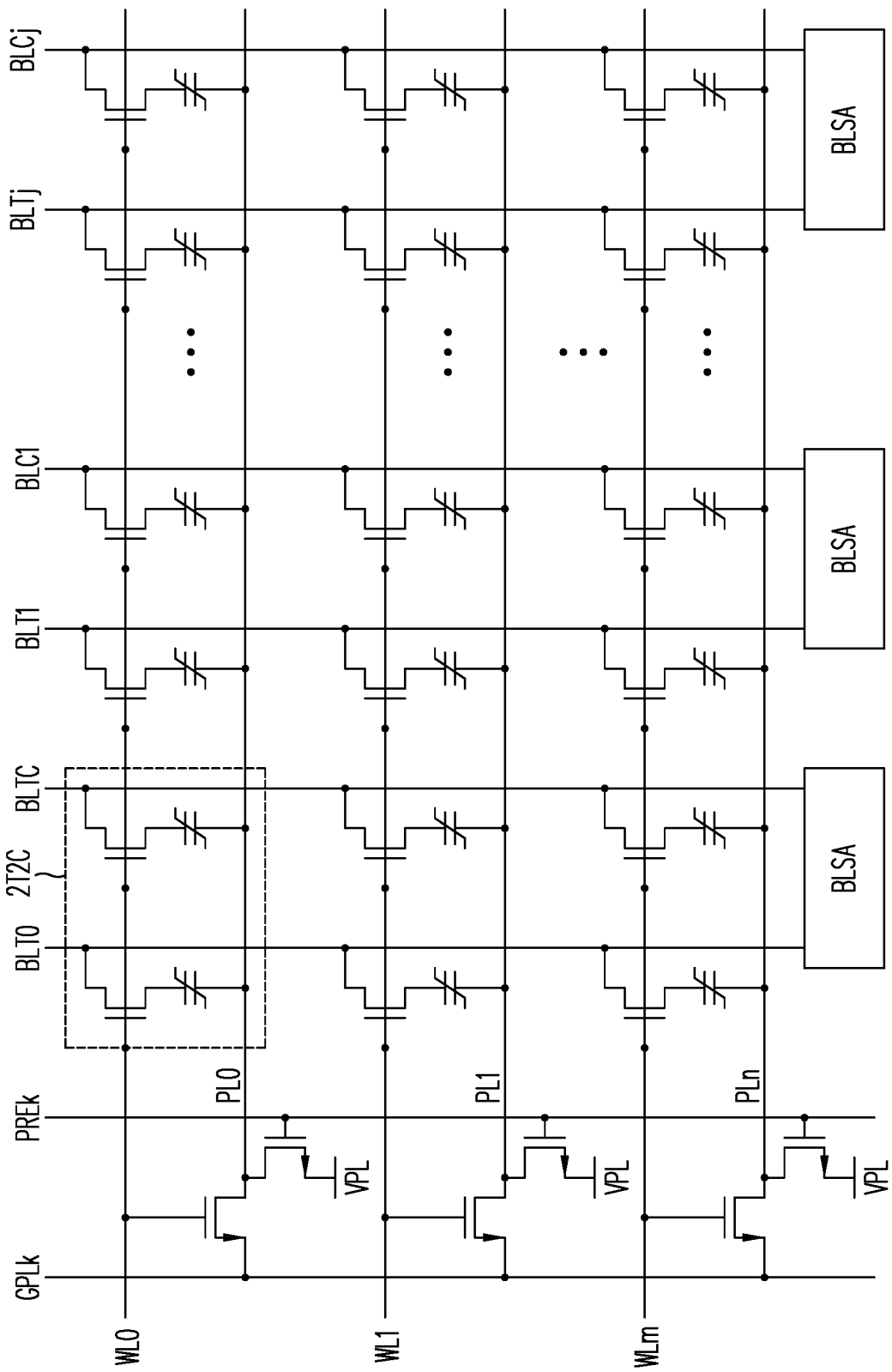

FIG. 4b shows ferroelectric memory array 450 with local plate line decoders of the present invention, suitable for implementing any of memory array sections 302-1, . . . , 302-m in ferroelectric memory array 300 of FIG. 2a. Ferroelectric memory array 450 implements an "open bit line" sensing scheme, known to those of ordinary skill in the art. Each memory cell of ferroelectric memory array 450 is a 2T2C cell, storing a data value in "true" and "complement" forms.

The detailed description above is provided to illustrate specific embodiments of the present invention and is not intended to be limiting. Numerous variations and modifications within the scope of the present invention are possible. The present invention is set forth in the accompanying claims.

I claim:

1. A ferroelectric memory array comprising:
   a driver circuit providing as output a first signal and a second signal;
   a plurality of word lines each providing a word line signal; and
   a plurality of memory array sections, each memory array section comprising:
   a plurality of bit lines;
   a plurality of plate line segments each associated with a corresponding one of the word line signals;
   a plurality of local plate line decoders, each local plate line decoder (i) being associated with one of the plate line segments, (ii) receiving as input the corresponding word line signal of the associated plate line segment, the first signal and the second signal, and (iii) providing as output one of a plurality of predetermined voltages on the associated plate line segment according to the received word line signal, the first signal and the second signal; and
   a plurality of memory cells, each memory cells having one or more ferroelectric capacitor connected between one of the plate line segments and one of the bit lines.

2. The ferroelectric memory array of claim 1, wherein the predetermined voltages include a voltage of the word line signal.

3. The ferroelectric memory array of claim 1, wherein the ferroelectric memory array receives a power supply voltage, and wherein the predetermined voltages include the power supply voltage and one half the power supply voltage.

4. The ferroelectric memory array of claim 3, wherein a write operation on a memory cell includes imposing a voltage difference across at least one of the ferroelectric capacitors of the memory cell that equals substantially the power supply voltage.

5. The ferroelectric memory array of claim 3, wherein a write operation on a memory cell includes imposing a voltage difference across at least one of the ferroelectric capacitors of the memory cell that equals substantially one half the power supply voltage.

6. The ferroelectric memory array of claim 1, wherein the memory array further comprises a signal generation circuit that operates selectively under a first mode and a second mode, wherein the signal generation circuit generates different signal values for the first signal and the second signal according to whether it is operating in the first mode or in the second mode.

7. The ferroelectric memory array of claim 6 wherein, under the first mode, the first and second signals each switch between two predetermined power supply voltages and wherein, under the second mode, the first and second signals each have a constant voltage.

8. The ferroelectric memory array of claim 7, wherein the constant voltage equals substantially to one half of one of the two predetermined power supply voltages.

9. The ferroelectric memory array of claim 6, wherein a data retention time associated with a write operation under the first mode is substantially longer than a data retention time associated with a write operation under the second mode.

10. The ferroelectric memory array of claim 1, each memory array section further comprises a plurality of sense amplifiers sensing a voltage one or more associated bit lines.

11. The ferroelectric memory array of claim 1, wherein the memory array sections are each organized under an open bit line architecture.

12. The ferroelectric memory array of claim 1, wherein each memory cell comprises two ferroelectric capacitors configured to hold true and complement representations of a data value.

\* \* \* \* \*